(12) United States Patent
Koyama et al.

(10) Patent No.: US 9,257,273 B2
(45) Date of Patent: Feb. 9, 2016

(54) CHARGED PARTICLE BEAM APPARATUS, THIN FILM FORMING METHOD, DEFECT CORRECTION METHOD AND DEVICE FORMING METHOD

(75) Inventors: Yoshihiro Koyama, Chiba (JP); Anto Yasaka, Tokyo (JP); Tatsuya Shimoda, Ishikawa (JP); Yasuo Matsuki, Tokyo (JP); Ryo Kawajiri, Ishikawa (JP)

(73) Assignees: HITACHI HIGH-TECH SCIENCE CORPORATION (JP); JAPAN SCIENCE AND TECHNOLOGY AGENCY (JP); JSR CORPORATION (JP)

(*) Notice: Subject to any disclaimer, the term of this patent is extended or adjusted under 35 U.S.C. 154(b) by 489 days.

(21) Appl. No.: 13/876,274

(22) PCT Filed: Sep. 22, 2011

(86) PCT No.: PCT/JP2011/071578
§ 371 (c)(1),
(2), (4) Date: Mar. 27, 2013

(87) PCT Pub. No.: WO2012/043363
PCT Pub. Date: Apr. 5, 2012

(65) Prior Publication Data
US 2013/0224889 A1    Aug. 29, 2013

(30) Foreign Application Priority Data

Sep. 28, 2010 (JP) ................................ 2010-217084

(51) Int. Cl.
*H01L 21/31* (2006.01)
*H01L 21/02* (2006.01)
(Continued)

(52) U.S. Cl.
CPC ........ *H01L 21/02263* (2013.01); *C23C 16/045* (2013.01); *C23C 16/24* (2013.01);
(Continued)

(58) Field of Classification Search
CPC ....................................................... H01L 21/31
See application file for complete search history.

(56) References Cited

U.S. PATENT DOCUMENTS 5,700,526 A    12/1997    Ximen et al. ................. 427/527
6,517,911 B1    2/2003    Matsuki ........................ 427/551
(Continued)

FOREIGN PATENT DOCUMENTS

EP    1959485    8/2008
GB    1145991    3/1969
(Continued)

OTHER PUBLICATIONS

Extended European Search Report issued Mar. 28, 2014 in European Patent Appln. No. EP 11 82 8920.

*Primary Examiner* — Marvin Payen
(74) *Attorney, Agent, or Firm* — Adams & Wilks

(57) ABSTRACT

A charged particle beam apparatus is provided that enables faster semiconductor film deposition than the conventional deposition that uses silicon hydrides and halides as source gases. The charged particle beam apparatus includes a charged particle source 1, a condenser lens electrode 2, a blanking electrode 3, a scanning electrode 4, a sample stage 10 on which a sample 9 is mounted, a secondary charged particle detector 8 that detects a secondary charged particle 7 generated from the sample 9 in response to the charged particle beam irradiation, a reservoir 14 that accommodates cyclopentasilane as a source gas, and a gas gun 11 that supplies the source gas to the sample 9.

15 Claims, 5 Drawing Sheets

(51) Int. Cl.
*H01J 37/317* (2006.01)
*C23C 16/04* (2006.01)
*C23C 16/24* (2006.01)
*C23C 16/32* (2006.01)
*C23C 16/40* (2006.01)
*C23C 16/42* (2006.01)
*C23C 16/48* (2006.01)
*C23C 16/56* (2006.01)
*H01L 21/66* (2006.01)
*H01L 21/28* (2006.01)
*H01L 29/66* (2006.01)

(52) U.S. Cl.
CPC ............ *C23C 16/325* (2013.01); *C23C 16/401* (2013.01); *C23C 16/42* (2013.01); *C23C 16/486* (2013.01); *C23C 16/487* (2013.01); *C23C 16/56* (2013.01); *H01J 37/3178* (2013.01); *H01L 21/0262* (2013.01); *H01L 21/02532* (2013.01); *H01L 21/02631* (2013.01); *H01L 21/28079* (2013.01); *H01L 21/28211* (2013.01); *H01L 22/20* (2013.01); *H01L 29/66568* (2013.01); *H01L 2924/0002* (2013.01)

(56) References Cited

U.S. PATENT DOCUMENTS

| | | | |
|---|---|---|---|
| 6,891,171 | B1 | 5/2005 | Hagiwara et al. ........... 250/492.2 |
| 2001/0021760 | A1 | 9/2001 | Matsuki et al. ................. 528/10 |
| 2002/0034585 | A1 | 3/2002 | Matsuki et al. ............... 427/228 |
| 2003/0087110 | A1 | 5/2003 | Furusawa et al. ............. 428/447 |
| 2008/0009140 | A1 | 1/2008 | Williamson et al. .......... 438/706 |
| 2008/0022897 | A1 | 1/2008 | Zurcher et al. ........... 106/287.14 |
| 2010/0197102 | A1 | 8/2010 | Akao et al. ..................... 438/303 |
| 2011/0318939 | A1 | 12/2011 | Shimoda et al. .............. 438/771 |

FOREIGN PATENT DOCUMENTS

| | | |
|---|---|---|
| JP | 07169679 | 7/1995 |
| JP | 09045922 | 2/1997 |
| JP | 2000012465 | 1/2000 |
| JP | 2000306906 | 11/2000 |
| JP | 2001262058 | 9/2001 |
| JP | 2002203794 | 7/2002 |
| JP | 2005166726 | 6/2005 |
| JP | 2008012391 | 1/2008 |
| JP | 2008130390 | 6/2008 |
| JP | 2008218615 | 9/2008 |
| JP | 2010079842 | 7/2010 |
| JP | 2010206161 | 9/2010 |

(a)

(b)

(c)

(a)

(b)

(a)

(b)

(c)

(d)

CHARGED PARTICLE BEAM APPARATUS, THIN FILM FORMING METHOD, DEFECT CORRECTION METHOD AND DEVICE FORMING METHOD

TECHNICAL FIELD

The present invention relates to a charged particle beam apparatus that process a sample with a charged particle beam.

BACKGROUND ART

Miniaturization of semiconductor devices has called for techniques for testing microscopic device-defects and correcting wiring. In a technique widely used for the testing of device defects, a microscopic test subject portion is cut out from a semiconductor wafer during a device forming process, and the microscopic portion is observed with a transmission electron microscope (TEM).

The microscopic portion is cut out from the semiconductor wafer by etching using a focused ion beam (FIB). The cut out microscopic portion is then observed under a TEM device. The semiconductor wafer after the cutting of the microscopic portion is brought back to the device forming step. The process hole formed when cutting out the microscopic portion is filled by local silicon film deposition using FIB before bringing the semiconductor wafer back to the device forming step. In this way, the FIB ion species injected into the semiconductor wafer by FIB irradiation can be prevented from spreading in the device forming step.

For wire correction, a technique of cutting and connecting wires with a charged particle beam apparatus is known. First, a process hole is formed with FIB around a correction portion. The wire at the correction portion is then cut by etching. This is followed by irradiation of a charged particle beam while supplying a metal-containing gas to form an appropriate metal wire. Finally, the process hole formed around the correction portion is filled by local silicon oxide film deposition using, for example, an electron beam that uses a silane-based gas (Patent Document 1). In this way, the device can operate normally after the wire correction.

CITATION LIST

Patent Document

Patent Document 1: JP-A-2005-166726

SUMMARY OF THE INVENTION

Problems that the Invention is to Solve

However, the formation of a silicon-based film with the conventional electron beam or focused ion beam has the drawback of slow deposition rate.

Conventionally, silicon hydrides and halides, such as silane ($SiH_4$), silicon iodide ($SiI_4$), and trichlorosilane ($SiHCl_3$), containing a single silicon atom per molecule have been used as deposition gases. These substances are gases at ordinary temperature. Further, these substances are adsorbed on a metal surface according to the Langmuir adsorption. The Langmuir adsorption assumes that each surface adsorption site can adsorb only a single molecule. It is also assumed in the Langmuir adsorption that multilayer adsorptions do not occur. Accordingly, the surface adsorption amount is small.

In a deposition step using a charged particle beam, a source gas is supplied to a sample, and the source gas component adsorbed on the sample is decomposed by the charged particle beam to form a film. Accordingly, the deposition rate is slow when the amount of the gas adsorbed on the sample is small.

This invention has been made under these circumstances, and it is an object of the invention to provide a charged particle beam apparatus that enables faster semiconductor film deposition than the conventional charged particle beam-induced semiconductor film deposition that uses silicon hydrides and halides as source gases.

Means for Solving the Problems

In order to achieve the foregoing object, the present invention provides the following means.

A charged particle beam apparatus according to the present invention includes: a charged particle source; a condenser lens electrode configured to condense a charged particle beam extracted from the charged particle source; a blanking electrode configured to switch irradiation and non-irradiation of the charged particle beam; a scanning electrode configured to scan and irradiate the charged particle beam; a sample stage on which a sample is configured to be mounted; a secondary charged particle detector configured to detect a secondary charged particle generated from the sample in response to the charged particle beam irradiation; a reservoir in which a silicon compound represented by a general formula (I) below is configured to be accommodated as a source gas; and a gas gun configured to supply the source gas to a position of the sample that is irradiated with the charged particle beam,

$$Si_nX_m \qquad (I)$$

(where n is an integer of 3 or larger, m is an integer of n, 2n−2, 2n, or 2n+2, and X represents a hydrogen atom and/or a halogen atom).

In this way, a silicon compound can be used to locally form a film.

Further, in the charged particle beam apparatus according to the present invention, the silicon compound is cyclopentasilane. In this way, the cyclopentasilane can be vaporized to locally and efficiently form a film.

Further, in the charged particle beam apparatus according to the present invention, the charged particle beam is an electron beam. In this way, a film containing no impurities can be formed.

Further, in the charged particle beam apparatus according to the present invention, the charged particle beam is an ion beam including one selected from gallium, gold, silicon, hydrogen, helium, neon, argon, xenon, oxygen, nitrogen, and carbon. In this way, a film containing the above-described ion and the silicon compound can be formed. Further, a film can be formed in which the above-described ion and the silicon compound have reacted.

Further, the charged particle beam apparatus according to the present invention includes a second gas supply system configured to supply a source gas different from the source gas. In this way, a film can be formed that contains a vapor component different from the silicon compound vapor. Further, a film can be formed in which a vapor component different from that of the silicon compound vapor has reacted.

A thin film forming method according to the present invention includes the steps of: irradiating a sample with a focused ion beam to form a pair of concave portions spaced apart from each other in a portion of a surface of the sample and to form a thin sample between the concave portions; detaching the thin sample from the sample; and supplying a silicon compound represented by a general formula (I) below as a source gas to the concave portions, and irradiating the sample with the charged particle beam while condensing the charged particle beam to form a film, $$Si_nX_m \quad (I)$$

(where n is an integer of 3 or larger, m is an integer of n, 2n−2, 2n, or 2n+2, and X represents a hydrogen atom and/or a halogen atom).

A defect correction method according to the present invention includes supplying a silicon compound represented by a general formula (I) below as a source gas to a nanoimprinting molding defect portion, and condensing a charged particle beam and irradiating the defect portion with the charged particle beam to form a film and correct the defect portion, $$Si_nX_m \quad (I)$$

(where n is an integer of 3 or larger, m is an integer of n, 2n−2, 2n, or 2n+2, and X represents a hydrogen atom and/or a halogen atom).

A device forming method according to the present invention includes the steps of: supplying a silicon compound represented by a general formula (I) below as the source gas to the sample, and irradiating the sample with the first charged particle beam while condensing the first charged particle beam to form the first thin film; and supplying the source gas to the sample, and irradiating the sample with a second charged particle beam of a beam type different from the first charged particle beam to form a second thin film of different functionality from the first thin film, $$Si_nX_m \quad (I)$$

(where n is an integer of 3 or larger, m is an integer of n, 2n−2, 2n, or 2n+2, and X represents a hydrogen atom and/or a halogen atom).

Advantage of the Invention

The charged particle beam apparatus according to the present invention enables faster semiconductor film deposition than the conventional deposition that uses silicon hydrides and halides as a source gas.

MODE FOR CARRYING OUT THE INVENTION

An embodiment of a charged particle beam apparatus according to the present invention is described below.

Figure 1:
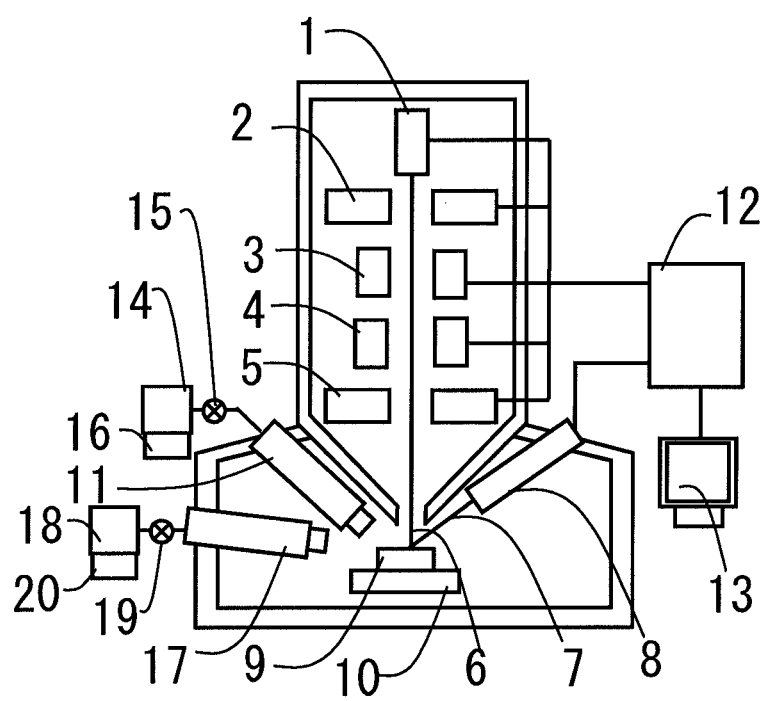
FIG. 1 is a structural diagram of a charged particle beam apparatus according to an embodiment of the present invention.

As illustrated in FIG. 1, the charged particle beam apparatus of the present embodiment includes a charged particle source 1 that generates a charged particle beam 6, and a charged particle optical system. The charged particle optical system includes a condenser lens electrode 2, a blanking electrode 3, a scanning electrode 4 for scanning, and an objective lens electrode 5. The condenser lens electrode 2 forms a condenser lens that condenses the charged particle beam 6 generated by the charged particle source 1. The blanking electrode 3 forms an electric field by which the charged particle beam 6 is deflected when a sample 9 is not to be irradiated with the charged particle beam 6. The scanning electrode 4 scans the charged particle beam 6. The objective lens electrode 5 forms an objective lens that condenses the charged particle beam 6 on a surface of the sample 9.

The charged particle beam apparatus also includes a sample stage 10 provided to mount the sample 9. The sample stage 10 is movable in five directions, including the three axes X, Y, and Z, and the tilt and rotational directions.

The charged particle beam apparatus also includes a secondary charged particle detector 8 that detects secondary charged particles 7 released from the sample 9 in response to the irradiation of the sample 9 with the charged particle beam 6. Also included is a control unit 12 that outputs control signals to the charged particle source 1 and the charged particle optical system. The control unit 12 also outputs a scan signal to the scanning electrode 4. The secondary charged particle detector 8 outputs a secondary electronic signal to the control unit 12. The control unit 12 forms an observation image from the secondary charged particle signal and the scan signal. A display unit 13 that displays the observation image is also included.

The charged particle beam apparatus also includes a gas gun 11 that supplies a deposition source gas to the sample 9. The gas gun 11 is connected to a reservoir 14 that accommodates the source gas. A valve 15 is provided between the gas gun 11 and the reservoir 14. By opening the valve 15, the source gas accommodated in the reservoir 14 is supplied to the gas gun 11. The source gas is supplied from the gas gun 11 to the sample 9. A heater 16 that heats the reservoir 14 is also provided. The source gas can be supplied to the gas gun 11 by being heated with the heater 16. When the source gas that liquefies or solidifies without being heated is used, the channel between the reservoir 14 and the gas gun 11, and the gas gun 11 are heated to temperatures above the temperature of the reservoir 14. This is to prevent the source gas from liquefying or solidifying in the gas flow channel.

When a source gas different from the source gas accommodated in the reservoir 14 is supplied to the sample 9, the charged particle beam apparatus uses a gas gun 17, a reservoir 18, a valve 19, and a heater 20 as a second gas supply system.

The charged particle source 1 is described below. Gallium, a gold-silicon-based alloy, or silicon is used as ion species when a liquid metal ion source is used as the charged particle source 1. A liquid metal is applied to a surface of an emitter needle to form a high electric field around the emitter needle. The liquid metal is ionized in the high electric field, and is released toward the sample 9.

When a plasma ion source is used as the charged particle source 1, a simple substance gas selected from hydrogen, helium, neon, argon, xenon, oxygen, and nitrogen is used as the ion species. An organic compound gas such as methane may be used for the irradiation of a carbon ion beam. Further, a compound gas selected from silane, arsine, and borane may be used for the irradiation of a silicon ion beam, an arsenic ion beam, and a boron ion beam, respectively. The plasma ion source supplies an ion species gas into an ion source chamber to form a plasma and release an ion beam. However, when a compound gas is used as ion species, it is preferable to separate the ion species with an E x B mass separator disposed between the charged particle source 1 and the sample 9. In this way, the sample 9 can be prevented from being irradiated with unnecessary ion species.

Further, when a field ionization ion source is used as the charged particle source 1, a simple substance gas selected from hydrogen, helium, neon, and argon is supplied as ion species to the emitter needle to form a high electric field around the emitter needle and release an ion beam.

Further, when an electron source is used as the charged particle source 1, a high electric field is formed around the emitter needle to release an electron beam.

The source gases for the semiconductor film deposition are described below. Silicon compounds represented by the following general formula (I) are used as the source substances.

$$Si_nX_m \qquad (I)$$

(where n is an integer of 3 or larger, m is an integer of n, 2n−2, 2n, or 2n+2, and X represents a hydrogen atom and/or a halogen atom).

The silicon is a precursor of the silicon film. The charged particle beam excitation cleaves the silicon-hydrogen bond, or the silicon-halogen atom bond, and forms a silicon-silicon bond and thus forms a silicon film. The halogen atom used may be a fluorine atom, a chlorine atom, a bromine atom, or an iodine atom.

Specific examples of $Si_nX_m$ for m=2n+2 include silane hydrides such as trisilane, tetrasilane, pentasilane, hexasilane, and heptasilane, including those in which some of or all of the hydrogen atoms are substituted with halogen atoms. For m=2n, specific examples of $Si_nX_m$ include silicon hydride compounds having a single ring, such as cyclotrisilane, cyclotetrasilane, cyclopentasilane, silylcyclopentasilane, cyclohexasilane, silylcyclohexasilane, and cycloheptasilane. Other examples include cyclic silicon halide compounds in which some of or all of the hydrogen atoms in the silicon hydride compounds are substituted with halogen atoms, specifically, for example, hexachlorocyclotrisilane, trichlorocyclotrisilane, octachlorocyclotetrasilane, tetrachlorocyclotetrasilane, decachlorocyclopentasilane, pentachlorocyclopentasilane, dodecachlorocyclohexasilane, hexachlorocyclohexasilane, tetradecachlorocycloheptasilane, heptachlorocycloheptasilane, hexabromocyclotrisilane, tribromocyclotrisilane, pentabromocyclotrisilane, tetrabromocyclotrisilane, octabromocyclotetrasilane, tetrabromocyclotetrasilane, decabromocyclopentasilane, pentabromocyclopentasilane, dodecabromocyclohexasilane, hexabromocyclohexasilane, tetradecabromocycloheptasilane, and heptabromocycloheptasilane. For m=2n−2, specific examples of $Si_nX_m$ include bicyclic silicon hydride compounds, such as 1,1'-biscyclobutasilane, 1,1'-biscyclopentasilane, 1,1'-biscyclohexasilane, 1,1'-biscycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2,2]pentasilane, spiro[3,3]heptasilane, spiro[4,4]nonasilane, spiro[4,5]decasilane, spiro[4,6]undecasilane, spiro[5,5]undecasilane, spiro[5,6]dodecasilane, and spiro[6,6]tridecasilane. Other examples include silicon compounds in which some of or all of the hydrogen atoms in the bicyclic silicon hydride compounds are substituted with $SiH_3$ groups or halogen atoms. For m=n, examples of $Si_nX_m$ include polycyclic silicon hydride compounds, and silicon compounds in which some of or all of the hydrogen atoms in the polycyclic silicon hydride compounds are substituted with $SiH_3$ groups or halogen atoms.

The source substances above are liquid or solid compounds at room temperature. These source substances have lower vapor pressures than silicon hydrides and halides, which are gases at room temperature, and an example of which is silane used in semiconductor manufacturing processes. For example, the vapor pressure of cyclopentasilane, a compound with five silicon atoms bound to each other to form a ring and including Si—Si bonds and Si—H bonds, is about 133 Pa. The intermolecular interaction is therefore large, and the amount of adsorption on the sample surface is also large. This is believed to be due to the adsorption phenomenon different from the Langmuir adsorption on the sample surface, for example, adsorption of multiple molecules. As a result, high-speed deposition is possible.

The following describes how the source gas is supplied. Cyclopentasilane is inserted into the reservoir 14. With the valve 15 open, the vaporized cyclopentasilane is supplied to the sample 9 through the gas gun 11. The reservoir 14 is heated with the heater 16 to adjust the supply amount of the cyclopentasilane. When source substances having high vapor pressures (such as trisilane) are used, a mass flow controller is installed between the reservoir 14 and the gas gun 11 to adjust the gas supply amount.

EXAMPLE 1-1

An example of the charged particle beam-induced semiconductor film deposition is described below. Cyclopentasilane is used as the source substance of the semiconductor film deposition. Cyclopentasilane is inserted into the reservoir 14. With the valve 15 open, the vaporized cyclopentasilane is supplied to the sample 9 through the gas gun 11. A gallium liquid metal ion source is used as the charged particle source 1. The surface of the sample 9 is scanned and irradiated with a gallium ion beam from the gallium liquid metal ion source according to the beam irradiation information output from the control unit 12. The cyclopentasilane has been adsorbed on the surface of the sample 9. Here, the sample 9 is at room temperature. The cyclopentasilane adsorbed on the sample surface is decomposed by the gallium ion beam irradiation, and a semiconductor film is formed in the region irradiated with the gallium ion beam. The deposition rate was 0.41 $\mu m^3/nC$.

EXAMPLE 1-2

The following describes the case where the gallium liquid metal ion source used in Example 1-1 is replaced with an electron source. The surface of the sample 9 supplied with cyclopentasilane is scanned and irradiated with an electron beam. The deposition rate is $3.36 \times 10^{-3}$ $\mu m^3/nC$, slower than in the deposition with the gallium ion beam. This is because electrons have a longer range than ions in a solid, and the percentage of the electrons that contribute to the cyclopentasilane decomposition necessary for the deposition is smaller.

However, while the deposition by metal ion irradiation produces a deposition film that contains about several percent to 30 percent of ion beam ion species, no ion species are contained in the deposition by electron beam irradiation. The electron beam deposition thus allows for formation of a semiconductor film with no impurities.

EXAMPLE 1-3

The following describes the case where the gallium liquid metal ion source used in Example 1-1 is replaced with an ion source that uses gases such as hydrogen and helium as ion species. The hydrogen or helium is ionized with a field ionization ion source, and an ion beam is released onto the cyclopentasilane-adsorbed surface of the sample 9. In this way, a semiconductor film containing no metal impurities can be formed. Further, because the hydrogen or helium ion beam has a shorter range than electrons in a solid, the deposition efficiency can be improved compared with using the electron beam.

EXAMPLE 1-4

The following describes the case where the gallium liquid metal ion source used in Example 1-1 is replaced with a plasma ion source that uses a compound gas selected from silane, arsine, and borane as ion species. The ion species gas is supplied into the ion source chamber to form plasma and release an ion beam. The cyclopentasilane-adsorbed surface of the sample 9 is then irradiated with the released ion beam. As a result, an intrinsic semiconductor film can be formed, when silane is used. When arsine is used, an n-type semiconductor film can be formed. When borane is used, a p-type semiconductor film can be formed.

The content of the ion species in the film is dependent on the deposition rate. The ion species content in the film is smaller when the deposition rate is higher. The deposition rate can be controlled by the supply amount of the source gas and the irradiation amount of the charged particle beam. A film with a low ion species content in the film can be formed by heating the reservoir 14 with the heater 16 to increase the supply amount of the gas source and to reduce the ion beam current amount used to irradiate the sample 9. In the event where controlling the supply amount of the source gas and the beam irradiation amount fails to provide a sufficient content, the second gas supply system may be used to supply the ion species as the deposition source gas, simultaneously with the cyclopentasilane. The sample may then be irradiated with an ion beam after the gases are adsorbed on the sample surface to compensate for the deficient content.

EXAMPLE 1-5

The following describes the case where the gallium liquid metal ion source used in Example 1-1 is replaced with an ion source that uses gold as ion species. The surface of the emitter needle is coated with gold, and a high electric field is formed around the emitter needle to release an ion beam. The cyclopentasilane-adsorbed surface of the sample 9 is then irradiated with the released ion beam. In this way, a film having high conductivity by containing gold can be formed.

EXAMPLE 1-6

The following describes the case where the gallium liquid metal ion source used in Example 1-1 is replaced with an ion source that uses oxygen or nitrogen as ion species. The cyclopentasilane-adsorbed surface of the sample 9 is irradiated with an ion beam that uses oxygen or nitrogen as ion species. As a result, a silicon oxide or silicon nitride film is formed. The silicon oxide or silicon nitride film is an insulating film. Because the silicon oxide film and silicon nitride film are transparent films, it is possible to form or repair transparent structures, including optical parts such as lenses, and nanoimprinting masks.

Oxygen or nitrogen is supplied to the surface of the sample 9 from the second gas supply system. In this way, the oxygen or nitrogen content in the silicon oxide film or silicon nitride film can be controlled. The gas gun 11 supplies the vaporized cyclopentasilane. The gas gun 17 supplies oxygen or nitrogen. A film having a large oxygen or nitrogen content can then be formed by irradiation of an oxygen or nitrogen ion beam. The reservoir 18 accommodating nitrogen may be connected to the gas gun 11, and a mixed gas of cyclopentasilane and nitrogen may be supplied from the gas gun 11.

EXAMPLE 1-7

The following describes the case where the gallium liquid metal ion source used in Example 1-1 is replaced with an ion source that uses carbon as ion species. The cyclopentasilane-adsorbed surface of the sample 9 is irradiated with a carbon ion beam. In this way, a silicon carbide film can be formed.

As described above, the functionality and the deposition rate of the deposition film can be controlled by controlling the beam species of the charged particle beam and the supply of the source gas.

EXAMPLE 2

An example of injecting the charged particle beam to a deposition film is described below. The cyclopentasilane-adsorbed surface of the sample 9 is irradiated with an oxygen or nitrogen ion beam to form a silicon oxide film or a silicon nitride film. Further, in order to increase the oxygen or nitrogen concentration, the silicon oxide film or silicon nitride film is irradiated with an oxygen or nitrogen ion beam for ion implantation. In this way, the oxygen or nitrogen concentration in the film can be increased.

Similarly, a p-type semiconductor film or an n-type semiconductor film may be irradiated with a boron, gallium, or arsenic ion beam to increase the dope amount of impurities.

EXAMPLE 3

An example of improving the crystallinity of a deposition film is described below. The cyclopentasilane-adsorbed surface of the sample 9 is irradiated with the charged particle beam to form a film. The film is mounted on the sample stage 10, and the sample stage 10 is heated. This heats the film, and improves the film crystallinity. Further, an electron source may be used as the charged particle source 1, and the film may be irradiated with an electron beam of a large current amount to heat the film. It is also possible to heat the film by irradiating the film with a laser.

EXAMPLE 4

Figure 2:
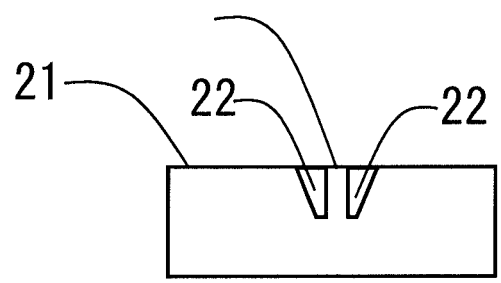
FIG. 2 is a schematic view representing TEM sample production and a filling process according to the embodiment of the present invention.
Figure 2:
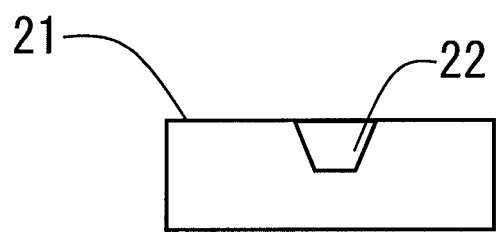
Figure 2:
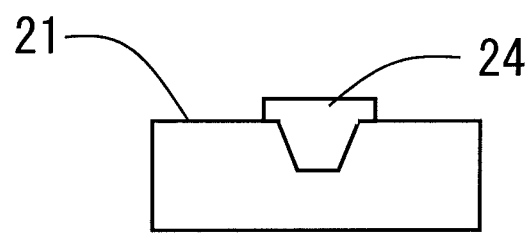

An example of a filling process after the TEM sample production is described below with reference to FIG. 2. FIG. 2(*a*) is a schematic view of a cross section of a wafer 21. A TEM sample 23 including a specific observation region is cut out from the wafer 21. A focused ion beam released from a gallium ion source scans and irradiates the region around the TEM sample 23 to form concave portions 22. The TEM sample 23 is processed by the focused ion beam in a thickness that allows for passage of a TEM electron beam. The processed TEM sample 23 is then detached from the wafer 21, and observed with a TEM. FIG. 2(*b*) is a schematic view of a cross section of the wafer 21 after the TEM sample 23 is detached. The focused ion beam irradiation has injected gallium ions to the bottom and the side walls of the concave portion 22. In order to prevent the injected gallium ions from spreading, a silicon film 24 is formed in the concave portion 22 to fill the concave portion 22. The gas gun 11 then supplies cyclopentasilane to the concave portion 22. The concave portion 22 is irradiated with an electron beam, using an electron source as the charged particle source 1. As a result, as shown in FIG. 2(c), a silicon film 24 is formed in the concave portion 22. The wafer 21 filled with the silicon film is brought back to the semiconductor device forming step.

As a means of forming the silicon film, liquid cyclopentasilane may be supplied to the concave portion 22. A filling process after the TEM sample production using liquid cyclopentasilane is described below.

Figure 3:
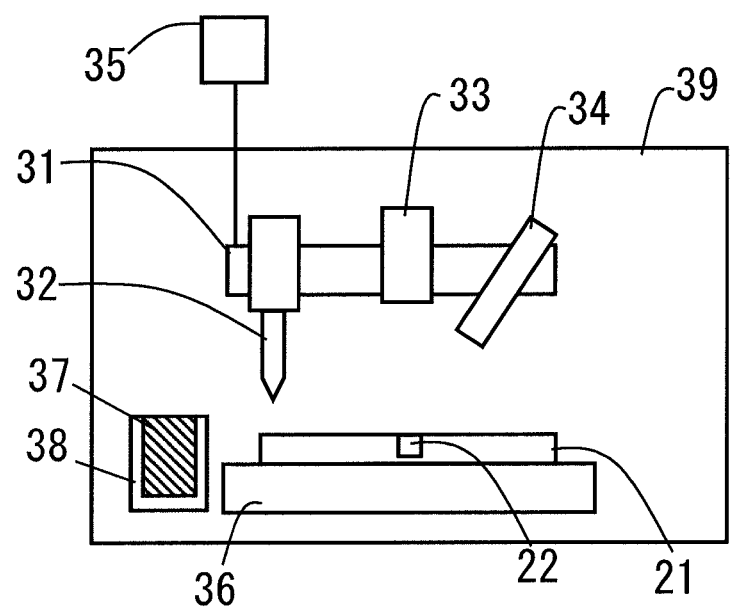
FIG. 3 is a structural diagram of a sample processing apparatus according to the embodiment of the present invention.

FIG. 3 is a structural diagram of a sample processing apparatus that uses liquid cyclopentasilane. Because the cyclopentasilane undergoes combustion upon reaction with oxygen, inside a sample chamber 39 is filled with nitrogen to make the oxygen content 1 ppm or less. The sample processing apparatus includes a head unit 31 equipped with a liquid ejector 32, a microscope section 33, and an UV irradiator 34. A head driving section 35 allows the head unit 31 to relatively move with respect to the sample stage 36. The wafer 21 is observed with the microscope section 33, and the liquid ejector 32 ejects the liquid cyclopentasilane to the concave portion 22. The UV irradiator 34 then irradiates UV rays. The liquid ejector 32 is provided with a container 38 containing liquid cyclopentasilane 37 for replenishing the liquid cyclopentasilane. The head unit 31 is moved, and the liquid ejector 32 is replenished with the liquid cyclopentasilane 37 contained in the container 38.

Procedures of the filling process after the TEM sample production are described below. The position of the concave portion 22 in the wafer 21 is confirmed with the microscope section 33. The head unit 31 is moved, and the liquid ejector 32 ejects the liquid cyclopentasilane to the concave portion 22. The UV irradiator 34 then irradiates the ejected liquid cyclopentasilane with UV rays to polymerize the liquid cyclopentasilane and form an amorphous silicon film. The concave portion 22 can thus be filled with the amorphous silicon film. Here, the ejected liquid cyclopentasilane may be turned into a polymer form by being irradiated with UV rays beforehand.

Figure 4:
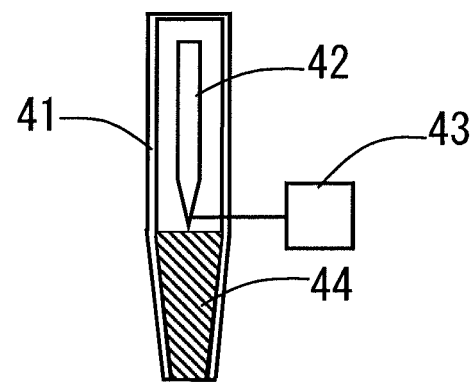
FIG. 4 is a structural diagram of a liquid ejector of the sample processing apparatus according to the embodiment of the present invention.
Figure 4:
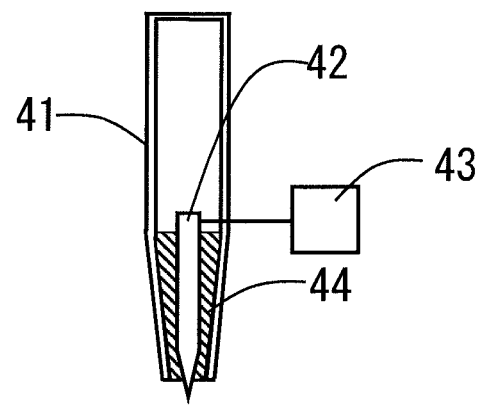

FIG. 4 is a structural diagram of the liquid ejector 32. A needle-shaped member 42 is provided in a glass tube 41. The glass tube 41 accommodates liquid cyclopentasilane 44. A needle-shaped member driving section 43 allows the needle-shaped member 42 to move up and down along the glass tube 41. The needle-shaped member 42 above the liquid level of the liquid cyclopentasilane 44 shown in FIG. 4(a) is moved down as to project out of the glass tube 41 as shown in FIG. 4(b). In this manner, the needle-shaped member 42 is moved to project out of the glass tube 41 with the liquid cyclopentasilane 44 adhering to the needle-shaped member 42, and to make contact with the desired location. In this way, the liquid cyclopentasilane 44 can be supplied to the desired location.

Procedures of the TEM sample production and the filling process using the charged particle beam apparatus and the sample processing apparatus are described below. The TEM sample 23 is produced with the charged particle beam apparatus that uses a liquid metal gallium ion source as the charged particle source 1, and the TEM sample 23 is detached from the wafer 21. Cyclopentasilane is supplied to the concave portion 22 from the gas gun 11, and irradiated with a gallium ion beam to form the silicon film 24. The wafer 21 is then moved to the sample processing apparatus, and the liquid ejector 32 supplies liquid cyclopentasilane onto the silicon film 24. The liquid cyclopentasilane is irradiated with UV rays from the UV irradiator 34 to form an amorphous silicon film. In this way, the silicon film 24 with the injected gallium ions can be covered with the amorphous silicon film that contains no metal impurities, and the wafer 21 can be brought back to the semiconductor device forming step.

EXAMPLE 5

An example of nanoimprinting mold correction is described below. Nanoimprinting is a technique whereby a plate having irregular patterns, called a mold, is pressed onto a liquid polymer or the like on a substrate, and the patterns are transferred by the compositional changes of the liquid polymer initiated by heat or light. The method of forming patterns by photo-irradiation is called photo-nanoimprinting, and uses a transparent film for the mold to allow for passage of light. Any defect portion created in the mold needs to be corrected.

The sample stage 10 is moved to allow the beam to irradiate the defect portion.

The gas gun 11 supplies the vaporized cyclopentasilane. The gas gun 17 supplies oxygen or water vapor to the defect portion of the mold. The defect portion is irradiated with an electron beam, using an electron source as the charged particle source 1. In this way, a transparent silicon oxide film can be formed in the defect portion. Because the cyclopentasilane does not contain carbon within the molecule, a weakly photoabsorbable film can be formed. In the manner described above, defects can be corrected by forming the transparent film in the defect portion.

EXAMPLE 6-1

Figure 5:
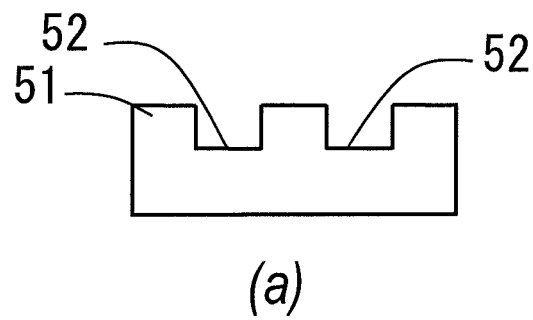
FIG. 5 is a schematic view representing device forming according to the embodiment of the present invention.
Figure 5:
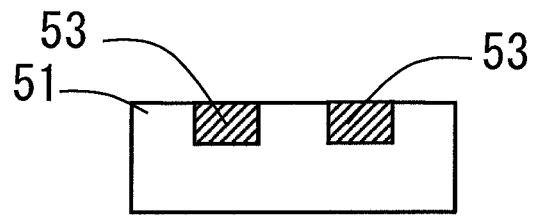
Figure 5:
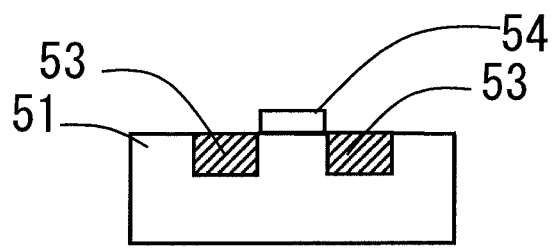
Figure 5:
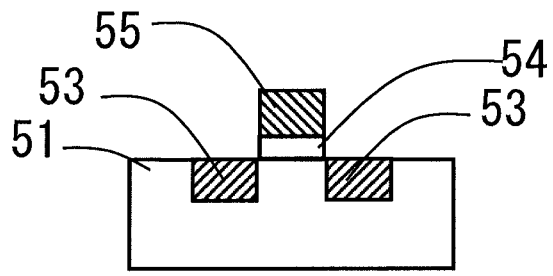

An example of device forming is described below. FIG. 5 is a schematic view representing device forming. A plasma ion source is used as the charged particle source 1. Arsine is introduced to the plasma ion source, and an arsenic ion beam is released to a substrate 51. As shown in FIG. 5(a), the substrate 51 is irradiated with an arsenic ion beam, and concave portions 52 are formed by etching. The arsine in the plasma ion source is then evacuated. Thereafter, diborane is introduced into the plasma ion source. The diborane is turned into a plasma by the plasma ion source, and an boron ion beam is released. As shown in FIG. 5(b), the gas gun 11 supplies cyclopentasilane to the concave portions 52, and the concave portions 52 are filled with a boron-containing silicon film formed by irradiation of the boron ion beam. As a result, MOS transistor source and drain regions 53 are formed.

Thereafter, the diborane inside the plasma ion source is evacuated. Then, oxygen is introduced into the plasma ion source. The oxygen is turned into plasma by the plasma ion source, and an oxygen ion beam is released. Then, the gas gun 11 supplies cyclopentasilane, followed by oxygen ion beam irradiation. As a result, a gate oxide film 54 is formed, as shown in FIG. 5(c).

Thereafter, the oxygen inside the plasma ion source is evacuated. Tungsten hexafluoride is then introduced into the plasma ion source. The tungsten hexafluoride is turned into plasma by the plasma ion source, and a tungsten ion beam is released. Then, the gas gun 11 supplies cyclopentasilane, followed by tungsten ion beam irradiation. As a result, a gate electrode 55 can be formed with the tungsten silicide film, as shown in FIG. 5(d).

A MOS transistor can be formed in this manner. A semiconductor device can thus be formed with the charged particle beam and cyclopentasilane, without using the conventional semiconductor lithography.

EXAMPLE 6-2

An example of supplying dopants with the source gas instead of the ion beam for the formation of the source and drain regions 53 of Example 6-1 is described below. As shown in FIG. 5(*a*), the substrate 51 is irradiated with an arsenic ion beam, and the concave portions 52 are formed by etching. Then, the arsine inside the plasma ion source is evacuated. Argon is then introduced into the plasma ion source. The argon is turned into a plasma by the plasma ion source, and an argon ion beam is released. As shown in FIG. 5(*b*), the gas gun 17 supplies a boron-containing silicon compound gas to the concave portions 52, and the concave portions 52 are filled with a boron-containing silicon film formed by irradiation of the argon ion beam. As a result, the MOS transistor source and drain regions 53 are formed.

Here, elements containing no metal, such as hydrogen, helium, neon, argon, and xenon, may be used as the ion species, instead of the argon ion beam. Further, an electron beam may be used instead of the ion beam.

Desirably, the boron-containing silicon compound gas is a boron-modified silane compound, or a boron hydride such as diborane.

Further, the gas gun 11 may supply cyclopentasilane to the concave portions 52, while the gas gun 17 simultaneously supplies a boron-containing silicon compound gas. The doping amount can be controlled by supplying the source gases from the two gas guns.

Further, a silicon film containing phosphorus may be formed by forming the concave portions 52 with the boron ion beam, and by supplying a phosphorus-containing silicon compound gas to the concave portions 52 from the gas gun 17, followed by irradiation with an argon ion beam.

Industrial Applicability

The present invention is applicable to the industrial fields of semiconductor devices and charged particle beam apparatuses.

Description Of Reference Numerals And Signs

1 Charged particle source
  2 Condenser lens electrode
  3 Blanking electrode
  4 Scanning electrode
  5 Objective lens electrode
  6 Charged particle beam
  7 Secondary charged particles
  8 Secondary charged particle detector
  9 Sample
  10 Sample stage
  11 Gas gun
  12 Control unit
  13 Display unit
  14 Reservoir
  15 Valve
  16 Heater
  17 Gas gun
  18 Reservoir
  19 Valve
  20 Heater
  21 Wafer
  22 Concave portion
  23 TEM sample
  24 Silicon film
  31 Head unit
  32 Liquid ejector
  33 Microscope section
  34 UV irradiator
  35 Head driving section
  36 Sample stage
  37 Liquid cyclopentasilane
  38 Container
  39 Sample chamber
  41 Glass tube
  42 Needle-shaped member
  43 Needle-shaped member driving section
  44 Liquid cyclopentasilane
  51 Substrate
  52 Concave portion
  53 Source and drain regions
  54 Gate oxide film
  55 Gate electrode

The invention claimed is:

1. A charged particle beam apparatus comprising:
a charged particle source;
a condenser lens electrode configured to condense a charged particle beam extracted from the charged particle source;
a blanking electrode configured to switch irradiation and non-irradiation of the charged particle beam;
a scanning electrode configured to scan and irradiate the charged particle beam;
a sample stage on which a sample is to be mounted;
a secondary charged particle detector configured to detect a secondary charged particle generated from the sample in response to irradiation of the sample with the charged particle beam;
a reservoir in which a silicon compound represented by a general formula (I) below is accommodated as a source gas; and
a gas gun configured to supply the source gas to a position of the sample that is irradiated with the charged particle beam, $$Si_nX_m \qquad (I)$$

(where n is an integer of 3 or larger, m is an integer of n, 2n−2, 2n, or 2n+2, and X represents a hydrogen atom and/or a halogen atom).

2. The charged particle beam apparatus according to claim 1, wherein the silicon compound is cyclopentasilane.

3. The charged particle beam apparatus according to claim 1, wherein the charged particle beam is an electron beam.

4. The charged particle beam apparatus according to claim 1, wherein the charged particle beam is an ion beam including one selected from gallium, gold, silicon, hydrogen, helium, neon, argon, xenon, oxygen, nitrogen, and carbon.

5. The charged particle beam apparatus according to claim 1, further comprising a second gas supply system configured to supply a source gas different from the source gas.

6. A thin film forming method for forming a thin film by supplying a source gas to a sample and condensing a charged particle beam to irradiate the sample, the method comprising:
supplying a silicon compound represented by a general formula (I) below as the source gas to the sample, and irradiating the sample with the charged particle beam while condensing the charged particle beam, $$Si_nX_m \qquad (I)$$

(where n is an integer of 3 or larger, m is an integer of n, 2n−2, 2n, or 2n+2, and X represents a hydrogen atom and/or a halogen atom).

7. The thin film forming method according to claim 6, wherein the silicon compound is cyclopentasilane.

8. The thin film forming method according to claim 6, further comprising supplying a source gas different from the source gas to the sample.

9. The thin film forming method according to claim 8, wherein the material of the different source gas is any one of water, oxygen, and nitrogen.

10. The thin film forming method according to claim 6, further comprising heating the thin film.

11. The thin film forming method according to claim 6, further comprising injecting an oxygen or nitrogen ion beam to the thin film.

12. A thin film forming method comprising the steps of:
irradiating a sample with a focused ion beam to form a pair of concave portions spaced apart from each other in a portion of a surface of the sample and to form a thin sample between the concave portions;
detaching the thin sample from the sample; and
supplying a silicon compound represented by a general formula (I) below as a source gas to the concave portions, and irradiating the sample with the charged particle beam while condensing the charged particle beam to form a film, $$Si_nX_m \qquad (I)$$

(where n is an integer of 3 or larger, m is an integer of n, 2n−2, 2n, or 2n+2, and X represents a hydrogen atom and/or a halogen atom).

13. The thin film forming method according to claim 12, wherein the charged particle beam is the focused ion beam.

14. A defect correction method comprising:
supplying a silicon compound represented by a general formula (I) below as a source gas to a nanoimprinting molding defect portion, and condensing a charged particle beam and irradiating the defect portion with the charged particle beam to form a film and correct the defect portion, $$Si_nX_m \qquad (I)$$

(where n is an integer of 3 or larger, m is an integer of n, 2n−2, 2n, or 2n+2, and X represents a hydrogen atom and/or a halogen atom).

15. A device forming method that includes a step of forming a first thin film by supplying a source gas to a sample and condensing a first charged particle beam to irradiate the sample, the method comprising the steps of:
supplying a silicon compound represented by a general formula (I) below as the source gas to the sample, and irradiating the sample with the first charged particle beam while condensing the first charged particle beam to form the first thin film; and
supplying the source gas to the sample, and irradiating the sample with a second charged particle beam of beam species different from the first charged particle beam to form a second thin film of different functionality from the first thin film, $$Si_nX_m \qquad (I)$$

(where n is an integer of 3 or larger, m is an integer of n, 2n−2, 2n, or 2n+2, and X represents a hydrogen atom and/or a halogen atom).

* * * * *